US009249940B2

(12) United States Patent  
Reiss et al.

(10) Patent No.: US 9,249,940 B2  
(45) Date of Patent: Feb. 2, 2016

(54) LIGHTING DEVICE AND METHOD FOR PRODUCING A LIGHTING DEVICE

(75) Inventors: Martin Reiss, Sinzing (DE); Gerhard Holzapfel, Rain (DE); Steffen Strauss, Nittendorf (DE)

(73) Assignee: OSRAM GMBH, Munich (DE)

( * ) Notice: Subject to any disclaimer, the term of this patent is extended or adjusted under 35 U.S.C. 154(b) by 149 days.

(21) Appl. No.: 14/112,942

(22) PCT Filed: Apr. 23, 2012

(86) PCT No.: PCT/EP2012/057358  
§ 371 (c)(1),  
(2), (4) Date: Oct. 21, 2013

(87) PCT Pub. No.: WO2012/146555  
PCT Pub. Date: Nov. 1, 2012

(65) Prior Publication Data  
US 2014/0043818 A1     Feb. 13, 2014

(30) Foreign Application Priority Data

Apr. 29, 2011    (DE) .......................... 10 2011 075 032

(51) Int. Cl.  
    *F21S 4/00*        (2006.01)  
    *F21V 21/00*     (2006.01)  
    (Continued)

(52) U.S. Cl.  
    CPC .................. *F21S 4/003* (2013.01); *F21S 4/006* (2013.01); *F21V 23/00* (2013.01); *F21V 31/04* (2013.01);  
    (Continued)

(58) Field of Classification Search  
    CPC .......... F21S 4/006; F21S 4/003; F21V 31/04; F21V 23/00; H05K 3/284; H05K 3/3405; H05K 1/189; H05K 2201/10106; H05K 2201/10189; H05K 2203/1476; F21Y 2101/02; F21Y 2103/003; Y10T 29/49117  
    USPC ......... 362/249.2, 257, 267, 404, 249.06, 375; 29/825; 257/98, 100; 313/498  
    See application file for complete search history.

(56) References Cited

U.S. PATENT DOCUMENTS

2008/0218072 A1*   9/2008   Haruna ................. H01L 33/508  
                                                                                    313/506  
2009/0011618 A1    1/2009   Stoyan  
(Continued)

FOREIGN PATENT DOCUMENTS

CN        1521863 A     8/2004  
CN    101114684 A     1/2008  
(Continued)

OTHER PUBLICATIONS

Chinese Office Action based on Application No. 201280021021.0 (7 pages and 5 pages of English translation) dated Jun. 26, 2015.

*Primary Examiner* — Anh Mai  
*Assistant Examiner* — Glenn Zimmerman  
(74) *Attorney, Agent, or Firm* — Viering, Jentschura & Partner

(57) ABSTRACT

A lighting device may include at least one semiconductor light source cast with at least one first casting compound, wherein at least one region of the lighting device has: at least one connection area, which is electrically connected to the at least one semiconductor light source, and at least one electrical connecting element, which has at least one electrical line, wherein at least one electrical line is connected to an associated connection area and protrudes at one end out of the lighting device, and the at least one connection area and the at least one electrical connecting element are arranged in a cutout in the first casting compound and are cast by means of a second casting compound.

14 Claims, 9 Drawing Sheets

(51) Int. Cl.
*F21V 31/04* (2006.01)
*H05K 3/28* (2006.01)
*H05K 3/34* (2006.01)
*F21V 23/00* (2015.01)
*F21Y 101/02* (2006.01)
*F21Y 103/00* (2006.01)
*H05K 1/18* (2006.01)

(52) U.S. Cl.
CPC .............. *H05K 3/284* (2013.01); *H05K 3/3405* (2013.01); *F21Y 2101/02* (2013.01); *F21Y 2103/003* (2013.01); *H05K 1/189* (2013.01); *H05K 2201/10106* (2013.01); *H05K 2201/10189* (2013.01); *H05K 2203/1476* (2013.01); *Y10T 29/49117* (2015.01)

(56) References Cited

U.S. PATENT DOCUMENTS

| 2012/0044689 | A1 | 2/2012 | Kraus et al. |
| 2012/0063139 | A1 | 3/2012 | Benkart et al. |

FOREIGN PATENT DOCUMENTS

| DE | 102007028463 | A1 | | 1/2009 |
| DE | 102009019285 | A1 | | 11/2010 |
| DE | 102009020851 | A1 | | 11/2010 |
| EP | 0760448 | A2 | | 3/1997 |
| WO | WO 2010026716 | A1 | * | 3/2010 |
| WO | 2010130735 | A1 | | 11/2010 |

* cited by examiner

LIGHTING DEVICE AND METHOD FOR PRODUCING A LIGHTING DEVICE

RELATED APPLICATIONS

This application is a national stage entry according to 35 U.S.C. §371 of PCT application No.: PCT/EP2012/057358 filed on Apr. 23, 2012, which claims priority from German application No.: 10 2011 075 032.0 filed on Apr. 29, 2011.

TECHNICAL FIELD

Various embodiments relate to a lighting device having at least one semiconductor light source cast with at least one first casting compound, wherein at least one region of the lighting device has at least one connection area, which is electrically connected to the at least one semiconductor light source, and at least one electrical connecting element.

BACKGROUND

Until now, LED strips have been known which have a strip-shaped printed circuit board which is populated on one side with a series of light-emitting diodes. The light-emitting diodes can be cast in silicone in order to protect against dust and/or moisture. For the electrical connection of the LED strip, until now an electrical plug-type connection has been known which is likewise arranged on the printed circuit board and which is cast first. For its use, a casting compound covering the plug-type connection in the plug-in direction needs to be removed so that plug-in contacts of the casting compound are exposed. One disadvantage with this is that this removal of the casting compound is complicated, in particular since the plug-type connection is typically not visible between the casting compound.

It is also known to solder electrical wires directly to connection areas and to then pass these wires individually out of the lighting device. Disadvantages here are a nonuniform appearance, the difficulty of soldering a plurality of the wires without short circuits and a lack of reliability of a subsequent encapsulation with casting compound, since the wires can also be subjected to tensile strain relatively easily through the casting compound on the connection area.

SUMMARY

Various embodiments consist in at least partially avoiding the disadvantages of the prior art and in particular providing a cast lighting device which is easy to produce and is visually appealing.

Various embodiments provide a lighting device, having at least one semiconductor light source cast with at least one first casting compound, wherein at least one region of the lighting device has: at least one connection area, which is electrically connected to the at least one semiconductor light source, and at least one electrical connecting element, which has at least one electrical line, wherein at least one electrical line is connected to an associated connection area and protrudes at one end out of the lighting device, and the at least one connection area and the at least one electrical connecting element are arranged in a cutout in the first casting compound and are cast by means of a second casting compound.

The lighting device can be in particular a lamp, a luminaire or a lighting module. The lighting device can be in particular a compact lighting module or a strip-shaped lighting strip.

Preferably, the at least one semiconductor light source includes at least one light-emitting diode. When a plurality of light-emitting diodes are provided, said light-emitting diodes may illuminate in the same color or in different colors. A color may be monochrome (for example red, green, blue, etc.) or multichrome (for example white). The light emitted by the at least one light-emitting diode may also be an infrared light (IR LED) or an ultraviolet (UV LED). A plurality of light-emitting diodes may produce a mixed light, for example a white mixed light. The at least one light-emitting diode can contain at least one wavelength-modifying phosphor (conversion LED). The phosphor can alternatively or additionally be arranged remotely from the light-emitting diode ("remote phosphor"). The at least one light-emitting diode may be in the form of at least one individually housed light-emitting diode or in the form of at least one LED chip. A plurality of LED chips can be mounted on a common substrate ("submount"). The at least one light-emitting diode may be equipped with at least one dedicated and/or common optical element for beam guidance, for example at least one Fresnel lens, collimator, or the like. Instead of or in addition to inorganic light-emitting diodes, for example on the basis of InGaN or AlInGaP, organic LEDs (OLEDs, for example polymer OLEDs) may generally also be used. Alternatively, the at least one semiconductor light source can have at least one diode laser, for example.

The fact that the at least one semiconductor light source is cast by means of at least one first casting compound can in particular include the situation where the at least one semiconductor light source is cast by means of a first casting compound or the at least one semiconductor light source is cast by means of a plurality of casting compounds, for example a plurality of layers of different first casting compounds. The casting compound may be in particular a silicone material which is advantageously inexpensive and can be configured so as to have long term stability, and so as to be flexible and optionally transparent or translucent.

The connection area may in particular be an electrical contact area, in particular a planar contact area. The electrical connection area can in particular be suitable for soldering or welding. The connection area may be provided directly at the at least one semiconductor source or may be connected to the at least one semiconductor source directly or indirectly (for example via a circuit or other electrical or electronic components) by means of an electrical wiring structure.

The at least one electrical line may be connected to the associated connection area by soldering or welding, for example.

By virtue of the fact that the at least one electrical line emerges from the lighting device at one end, said electrical line can be electrically connected externally there, for example to other lighting devices and/or to an external current source.

The fact that the at least one connection area and the at least one electrical connecting element are arranged in a cutout or recess in the first casting compound can mean that the at least one connection area and the at least one electrical connecting element were previously covered with the at least one casting compound and then said casting compound was removed. Alternatively, the at least one connection area and the at least one electrical connecting element may not have been cast with the at least one casting compound, but a cutout may have been formed in this casting.

The fact that the at least one cutout or recesses has been cast by means of a second casting compound means in particular that the semiconductor light sources are cast by means of the at least one first casting compound and the at least one connection area and the at least one electrical connecting element, adjacent to this, are cast by means of the second casting compound.

The lighting device may have one or more such regions. Each of the regions advantageously has a cut-away portion and an electrical connecting element. The electrical connecting element preferably has a plurality of electrical lines, and the number of connection areas per region preferably corresponds to the number of electrical lines of the associated electrical connecting element.

This lighting device has the advantage that the at least one electrical line can be connected (soldered, welded, etc.) to a respective connection area in a comparatively simple and reliable manner. The at least one connection area and the at least one electrical connecting element are additionally capable of being protected against dust and moisture by the second casting compound, in particular in accordance with one or more IP protection classes. The use of the cut-away portion of the first casting compound also enables simple and precise casting. Furthermore, this lighting device is variable with a level of production complexity which only changes slightly in terms of its electrical connection (for example the number of electrical lines and/or connection areas). This favors mass production of the lighting device. A visually appealing configuration is also possible. The use of a dedicated electrical connecting element also enables simple, identical positioning of the electrical lines, even lines of different lengths. In addition, strain relief on the electrical lines is also enabled in a simple manner, which increases reliability.

One configuration consists in that the at least one electrical connecting element has a body, through which at least one electrical line is passed. The electrical line is in particular introduced fixedly in the body in order to favor strain relief. The body may in particular be a plastics body, in particular a solid body. The at least one electrical line may be in particular a sheathed or bare wire, in particular as part of a cable.

A further configuration consists in that the body has at least one groove on the outside, in particular a peripheral groove. The at least one groove favors areal covering of the body with the second casting compound by virtue of producing a capillary effect. The at least one groove also enables a form-fitting connection of the body in the casting compound.

Yet a further configuration consists in that the body has at least one spacer on the outside. This at least one spacer enables covering of a side of the body which is spaced apart from the spacer with respect to an adjacent wall, in particular if this side of the body has one or more grooves.

A further configuration consists in that the body has a laterally protruding, peripheral wall on the side on which the at least one associated electrical line emerges from the lighting device. This wall enables the use of the body as a stopper or barrier, in particular when using in a channel which is closed laterally (not at the ends), with the result that the cut-away portion can be filled safely with the second casting compound and there is no risk of the second casting compound dripping out of the lighting device in the region of the body.

A further configuration consists in that the wall has a non-uniform height. Thus, the body can also safety shut off laterally open channels up to a fill height corresponding to the wall height. Alternatively, the wall has a height which is at least substantial uniform peripherally.

In addition, a configuration consists in that the at least one electrical connecting element has two or four electrical lines. The electrical lines are preferably offset laterally with respect to one another in order to enable simple fastening on the respective connection area without being impeded by an adjacent electrical line.

A further configuration consists in that the at least one connection area is exposed with respect to the at least one first casting compound by means of the at least one cutout, and/or the at least one electrical connecting element is accommodated in a laterally closed (tubular) channel which leads outward and closes the channel, in particular on the outside. The fact that the at least one connection area is exposed, can be reached in particular directly with a tool, enables fastening of the electrical line(s) on the connection area(s) with a low level of complexity involved in the handling. The provision of the channel enables easy introduction and defined positioning of the connecting element with at the same time drip-free casting.

In addition, a configuration consists in that the at least one connection area is exposed with respect to the at least one first casting compound by means of the at least one cutout, and the at least one electrical connecting element is accommodated in an open channel which leads outward and shuts off or closes the channel, in particular from the outside or in an outer region. This enables easier removal or cutting away of the first casting compound and safer casting of the connecting element.

Yet a further configuration consists in that the at least one connection area is inhibited with respect to the first casting compound directly covering the at least one connection area (but in particular not with respect to the second casting compound). This enables simple and in particular residue-free removal of the first casting compound from the at least one connection area, which in turn improves reliability of the connection with an electrical line to be connected later. The inhibiting therefore suppresses in particular adhesion of the first casting compound to the connection area.

Another configuration consists in that a first casting compound directly covering the at least one connection area and the second casting compound are different. Thus, the inhibiting may not be effective with respect to the second casting compound.

Quite generally, at least one first casting compound and the second casting compound may have an identical material. Alternatively, at least one first casting compound and the second casting compound can have an identical base material, for example silicone, but different fillers. In yet another alternative, at least one first casting compound and the second casting compound may have a different base material, for example silicone or ABS, for example with identical or different filler(s).

The at least one first casting compound may have a single first casting compound or a plurality of different first casting compounds which are arranged differently physically, for example a plurality of layers of casting compounds.

In addition, a configuration consists in that the at least one first casting compound has a lower (first first) casting compound, by means of which the at least one semiconductor light source is cast up to below its emitter face, and an upper (second first) casting compound, by means of which the emitter face is cast. A view onto the at least one semiconductor light source and a substrate therebeneath can be influenced, in particular prevented, by the lower casting compound, which improves the appearance of the lighting device. The lower casting compound can in particular be opaque. The upper casting compound can in particular be transparent in order to suppress optical losses. The upper casting compound can in particular be translucent for homogenization of the emitted light.

The at least one semiconductor light source may be arranged on a substrate. A plurality of semiconductor light sources may be arranged on a common substrate. The substrate may in particular be a printed circuit board. The printed circuit board may in particular be a printed circuit board in the form of a circular disk or a strip-shaped printed circuit board.

The printed circuit board may be in particular a mechanically flexible printed circuit board, in particular a strip-shaped flexible printed circuit board. In particular, lighting strips from the LINEARlight Flex series by Osram may be used. In particular together with elastic casting compounds, an overall elastically deformable lighting device can thus be provided, in particular in the sense of an encapsulated lighting strip.

In addition, a configuration consists in that the lighting device is a lighting strip (with a strip-shaped, flexible or inflexible substrate), and the regions of the lighting device (which each have at least one connection area) are end regions, to be precise at one or both ends.

Various embodiments also provide a method for producing a lighting device, having at least the following steps: providing a lighting device, which has at least one semiconductor light source and at least one connection area, which is electrically connected to the at least one semiconductor light source, which semiconductor light sources are cast by means of at least one first casting compound, removing some of the first casting compound, with the result that the at least one connection area is exposed and is connected to an outer side via a channel; inserting an electrical connecting element with at least one electrical line into the channel, with the result that the electrical connecting element shuts off the channel and the electrical line protrudes outward; connecting at least one electrical line of the electrical connecting element to a respective connection area; and casting the at least one connection area and the at least one electrical connecting element with at least one second casting compound.

As a result, the same advantages as in the above described lighting device are achieved. The method may also be configured analogously to the lighting device.

For example, one configuration may consist in that the method has the following proceeding steps: inhibiting the at least one connection area; casting the at least one semiconductor light source and the at least one connection area to the at least one first casting compound, wherein inhibiting the at least one connection area includes inhibiting with respect to the first casting compound which directly covers the at least one connection area.

BRIEF DESCRIPTION OF THE DRAWINGS

In the drawings, like reference characters generally refer to the same parts throughout the different views. The drawings are not necessarily to scale, emphasis instead generally being placed upon illustrating the principles of the disclosed embodiments. In the following description, various embodiments described with reference to the following drawings, in which.

DETAILED DESCRIPTION

The following detailed description refers to the accompanying drawing that show, by way of illustration, specific details and embodiments in which the disclosure may be practiced.

Figure 1:
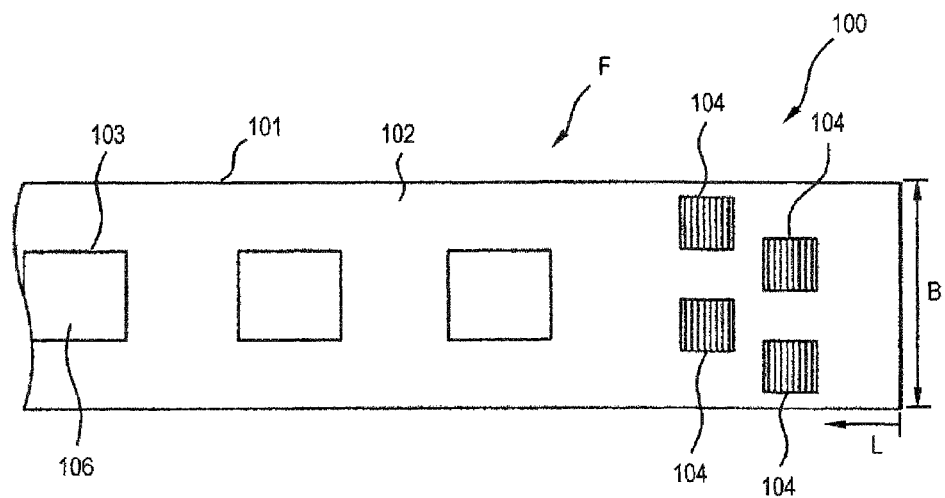
FIG. 1 shows a plan view of an end-side detail of an LED lighting strip as a preliminary stage of a lighting device according to the disclosure in accordance with a first embodiment.

FIG. 1 shows a plan view of an end-side detail of a lighting strip F in the form of an LED lighting strip as a preliminary stage of a lighting device 100 in accordance with a first embodiment. The lighting strip F has a strip-shaped substrate in the form of a strip-shaped, flexible printed circuit board 101, whose upper side or front side of 102 is shown. The printed circuit board 101 can have, for example, polyimide as base material. A plurality of light-emitting diodes (LEDs) 103 are arranged in series equidistantly on the front side 102. Electrical contact can be made between the light-emitting diodes via a plurality of (in this case four) electrical contact areas or connection areas 104 arranged on the front side 102. Associated wiring of the printed circuit board 101 is not shown, but is present.

The connection areas 104 are offset equidistantly laterally (with respect to a width B of the printed circuit board 101). In addition, the connection areas 104 are offset alternately in two rows with respect to a length L of the printed circuit board 101. Such an arrangement simplifies a mechanically secure fastening of connection elements and prevents possible short circuits whilst maintaining a compact arrangement.

Figure 2:
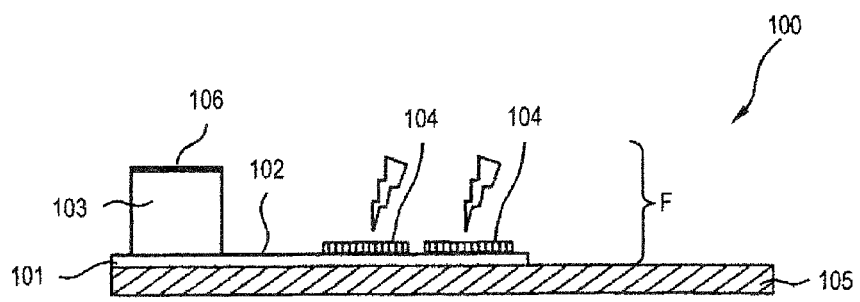
FIG. 2 shows a side view of a detail of an LED lighting strip applied to a mount in a further preliminary stage of the lighting device according to the disclosure.

FIG. 2 shows a side view of a detail of the lighting strip F lying on a mount 105 as a further preliminary stage of the lighting device 100. The mount 105 can consist in particular of silicone or of another elastic material in order to be able to bend the later lighting device 100 without it being destroyed, in particular in order to be able to bend it elastically. The mount 105 can be configured as a flat base or preferably with a U shape along the length L in a front view. The lighting strip F may in particular be inserted into the mount 105 which is U-shaped in profile. A U-shaped mount 105 may in particular act as a form for subsequent filling with casting compound(s), wherein it simplifies filling with a casting compound by virtue of the provision of the side walls.

The light-emitting diode 103 is in this case an upwardly emitting light-emitting diode ("Top LED") with an upper emitter face 106.

The connection areas 104 are inhibited at this production stage, as indicated by the zigzag arrows. As a result, the adhesion capacity of these connection areas is reduced in comparison with a casting compound subsequently cast thereon.

Figure 3:
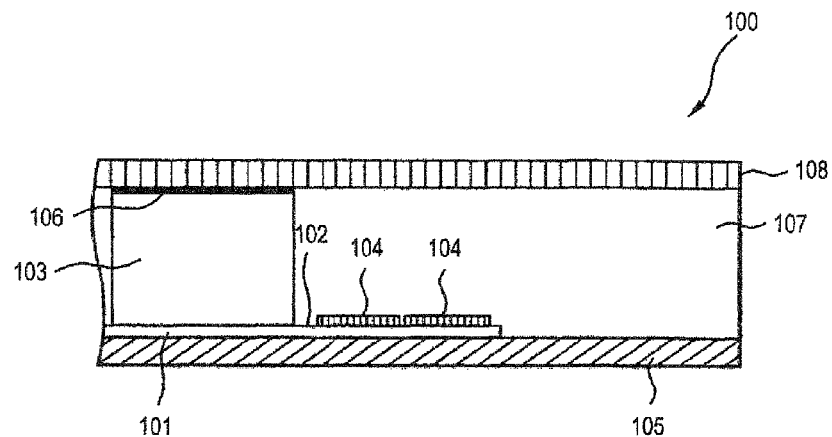
FIG. 3 shows a sectional illustration in a side view of a detail of a now cast LED lighting strip as a further preliminary stage of the lighting device according to the disclosure.

FIG. 3 shows a sectional illustration in a side view of a detail of the now cast lighting strip F as yet a further preliminary stage of the lighting device 100.

The lighting strip F is cast by means of two first casting compounds 107, 108, namely a lower casting compound 107 and an upper casting compound 108. The lower casting compound 107 is in this case opaque silicone and covers the sides, but not the emitter faces 106 of the light-emitting diodes 103. The lower casting compound 107 also covers the rest of the printed circuit board 101 including the connection areas 104. A layer of the upper casting compound 108, which covers the emitter faces 106, is provided on the lower casting compound 107. The upper casting compound 108 consists of transparent or translucent silicone. The mount 105, the lower casting compound 107 and the upper casting compound 108 protrude at the front end or at the end beyond the printed circuit board 101 or the lighting strip F (towards the right in FIG. 3).

Figure 4:
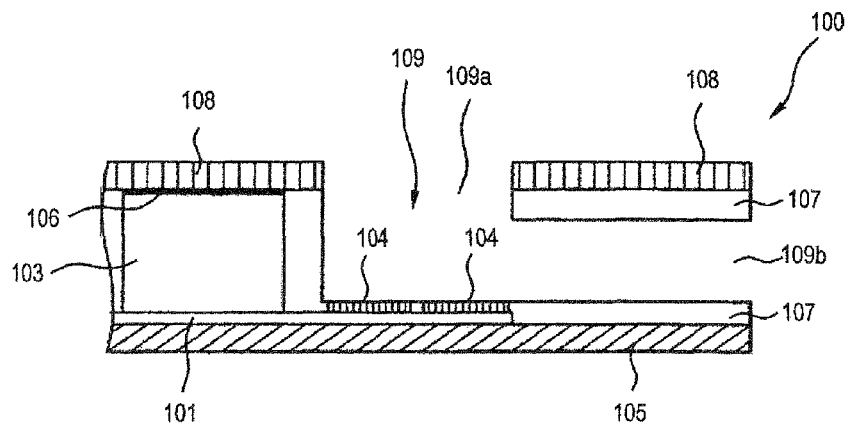
FIG. 4 shows a sectional illustration in a side view of a detail of the cast LED lighting strip in yet a further preliminary stage of the lighting device according to the disclosure.

FIG. 4 shows the cast LED lighting strip F in an illustration similar to that in FIG. 3 at yet a further preliminary stage of the lighting device 100 accordance to the disclosure. At this preliminary stage, a cutout or cut-away portion 109 has been produced in the first casting compound 107, 108, which cutout or cut-away portion exposes the surface of the connection areas 104 so as to be directly accessible from above. The cut-away portion 109 has a subregion 109a, which is provided above the connection areas 104, is open at the top and from which a laterally extending, outwardly leading channel 109b emerges. In this case, the channel 109b opens out into an end-side or front end-side face of the lighting device 100. The channel 109b runs in the lower casting compound 107 and is closed laterally (but not at the end) and has in particular the form of a tube. The channel 109b can in particular have a rectangular basic shape in profile with respect to its longitudinal extent.

Figure 5:
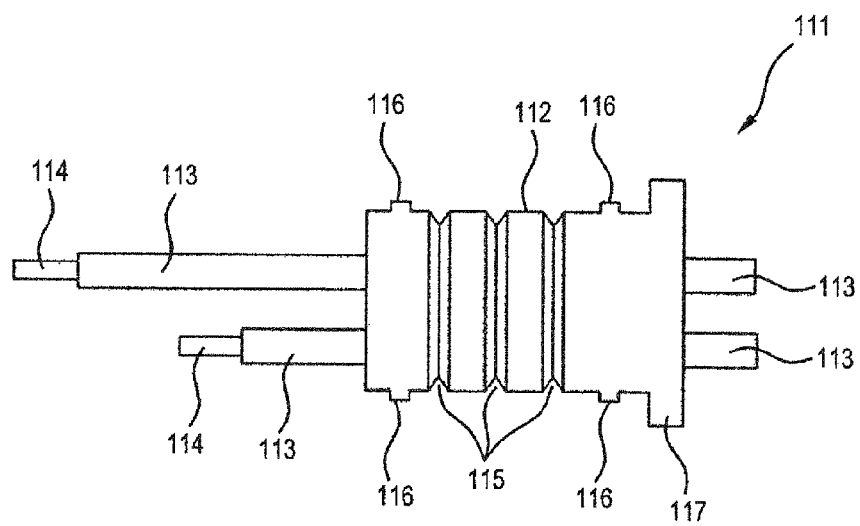
FIG. 5 shows a side view of an electrical connecting element of the lighting device according to the disclosure.

FIG. 5 shows a side view of an electrical connecting element 111 for use with the lighting device 100, in particular for external insertion into the channel 109b. The connecting element 111 has a body 112 consisting of plastics, through which four electrical lines 113 are passed. The electrical lines 113 are in the form of sheathed wires. The electrical lines 113 are fixedly connected to the body 112. The electrical lines 113 are formed on a side intended for connection to a respective connection area 104 in such a way that their ends 114 may easily be brought into contact with the respectively provided connection area 104 and can be connected thereto. For this purpose, the ends 114 are at different distances apart from the body 112, in pairs, for example.

The body 112 has three laterally peripheral grooves 115 in order to assist flat casting of the body 112, in particular by means of a capillary effect.

In addition, the body 112 has spacers 116 on each of its sides (the lateral surface) in order to thus assist casting of the body 112 on all sides.

At an end position of the body 112 which is provided for external arrangement, the body 112 has a laterally protruding, peripheral wall 117. This wall serves to be placed on the outside on the channel 109b and can close said channel.

Figure 6:
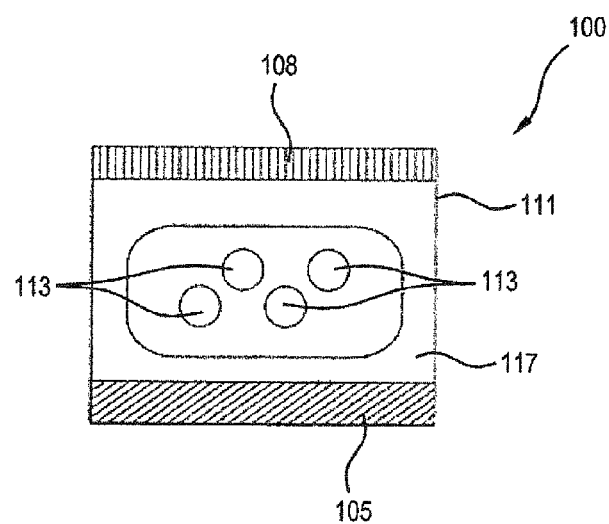
FIG. 6 shows a front view of an end face of the unfinished lighting device with the electrical connecting element inserted.

FIG. 6 shows a front view of an end face of the unfinished lighting device 100 with the electrical connecting element 111 inserted. The electrical lines 113 are laterally offset similarly to the connection areas 104 in order to facilitate contact-making and suppress a short circuit.

Figure 7:
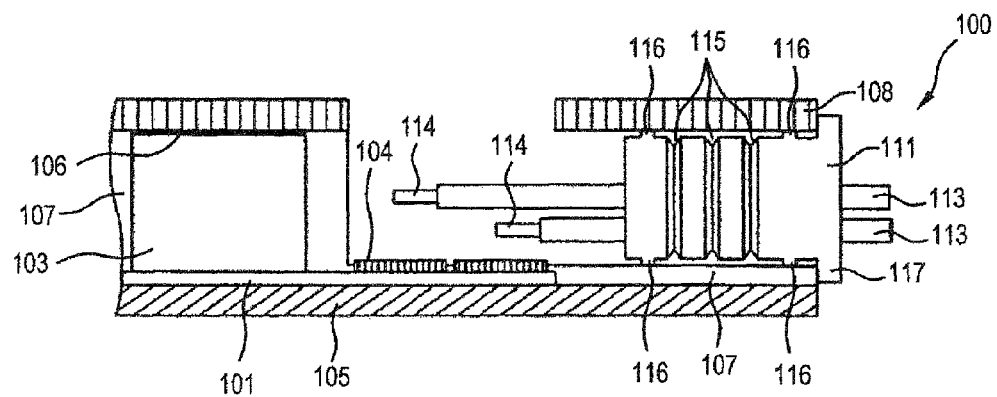
FIG. 7 shows a sectional illustration in a side view of a detail of yet a further preliminary stage of the lighting device according to the disclosure with the connecting element inserted.

FIG. 7 shows a sectional illustration in a side view of a detail of yet a further preliminary stage of the lighting device 100 with the connecting element 111 introduced or inserted into the channel 109b from the outside. This preliminary stage follows the preliminary stage shown in FIG. 4. The connecting element 111 acts as a stopper and shuts off the channel 109b on the outside. The electrical lines 113 protrude outward and may thus connected externally.

Figure 8:
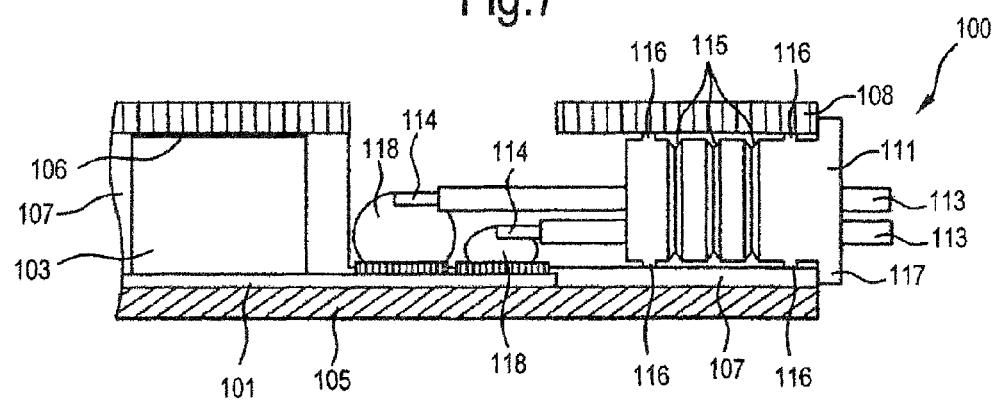
FIG. 8 shows a sectional illustration in a side view of a detail of yet a further preliminary stage of the lighting device according to the disclosure.

FIG. 8 shows a detail of yet a further preliminary stage of the lighting device 100. In this preliminary stage, which follows the preliminary stage shown in FIG. 7, the exposed ends 114 of the electrical lines 113 are connected, in this case soldered with solder 118, to those respective connection areas 104 over which they are arranged. This soldering is particularly easy to implement since the exposed ends 114 and the connection areas 104 are accessible from above and are distributed physically sufficiently far apart from one another.

Figure 9:
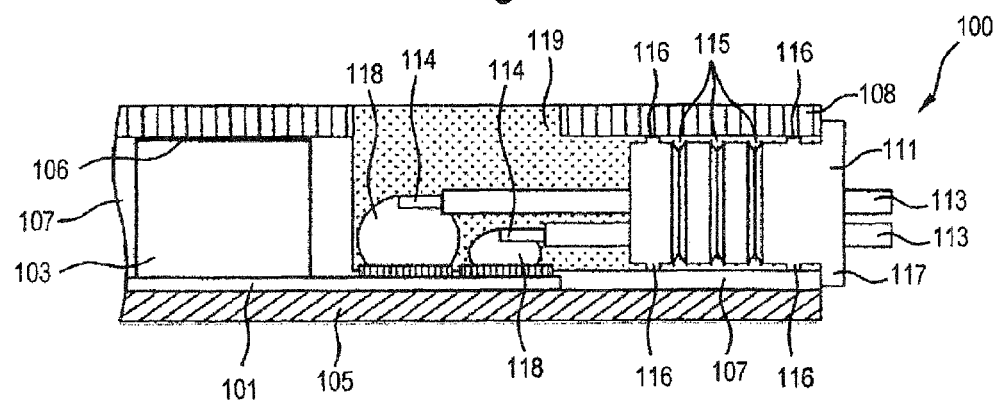
FIG. 9 shows a sectional illustration in a side view of the finished lighting device according to the disclosure in accordance with the first embodiment.

FIG. 9 shows the finished lighting device 100. In the finished lighting device 100, the cut-away portion 109 has been cast completely with a second casting compound 119. Owing to the spacers 116 and the grooves 115, the second casting compound 119 surrounds the body 112 substantially completely within the channel 109b. The wall 117 prevents the second casting compound 119 from being able to flow out of the channel 109b. The second casting compound 119 is filled up to the level of the upper casting compound 108. Therefore, the connecting areas 104 and the connecting element 111 are cast by means of the second casting compound 119.

The finished lighting device 100 can be bent to a high degree without any destruction with respect to its longitudinal alignment. The electrical connecting element 111 in this case enables a connection with strain relief between the electrical lines 113 and the connection areas 104 in the case of a bent lighting device 100.

Figure 10:
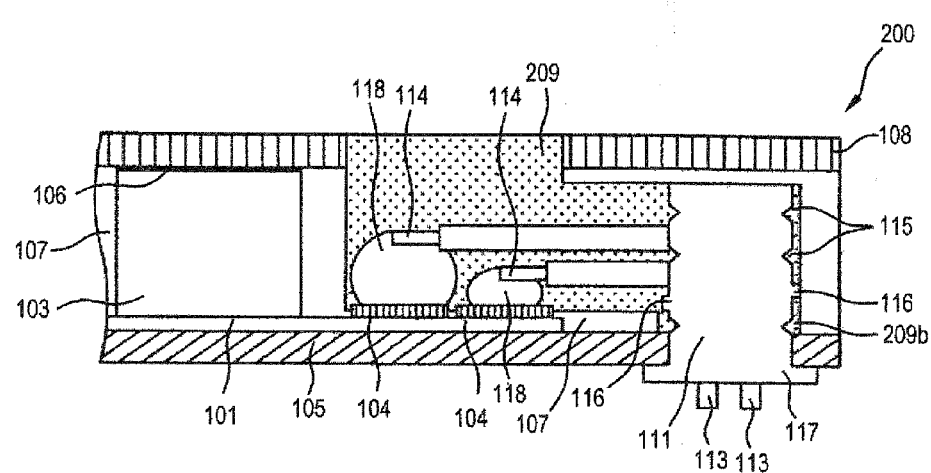
FIG. 10 shows a sectional illustration in a side view of a lighting device according to the disclosure in accordance with a second embodiment.

FIG. 10 shows a lighting device 200 in accordance with a second embodiment which is similar to the lighting device 100. In contrast to the lighting device 100, in the lighting device 200 the channel 209b of the cut-away portion 209 points downward and therefore opens out into a lower side of the lighting device 200. Therefore, the electrical lines 113 also protrude downward. The channel 209b is passed through the lower casting compound 107 and the mount 105.

Figure 11:
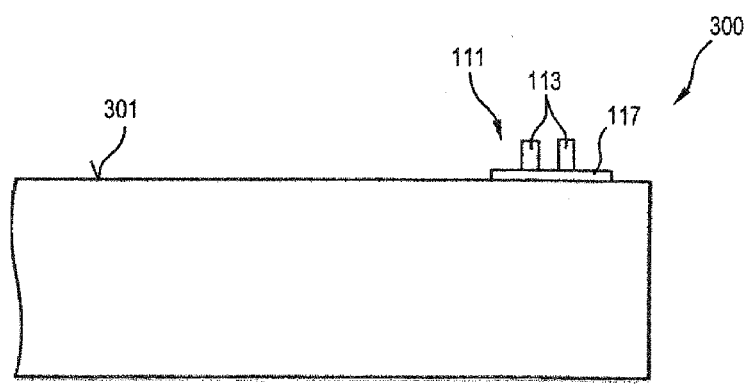
FIG. 11 shows a plan view of a lighting device according to the disclosure in accordance with a third embodiment.

FIG. 11 shows a plan view of a lighting device 300 in accordance with a third embodiment. In the lighting device 300, the channel of the cut-away portion points towards the side and therefore opens out in a longitudinal side 301 of the lighting device 300. Therefore, the electrical lines 113 also protrude laterally.

The channel 209b may be passed in particular through a side wall of a mount 105 which is U-shaped in profile.

Figure 12:
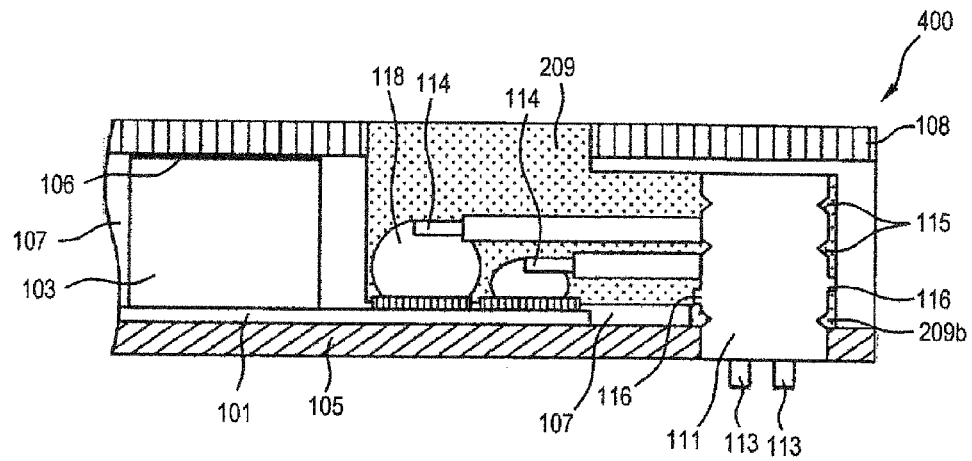
FIG. 12 shows a sectional illustration in a side view of a lighting device according to the disclosure in accordance with a fourth embodiment.

FIG. 12 shows a sectional illustration in a side view of a lighting device 400 in accordance with a fourth embodiment. The lighting device 400 has a similar construction to the lighting device 200, but has a different electrical connecting element 411. The electrical connecting element 411, in contrast to the connecting element 111, does not have a laterally peripheral wall 117, but otherwise has a similar design. Instead, the body 412 of the connecting element 411 has a smooth shape at its outer-side end of the lateral surface, which shape can be inserted tightly into the channel 209b with a pressed fit. As a result, now only the electrical lines 113 protrude out of the lighting device 400.

In this case, the electrical lines 113 protrude on the connection area side out of the lateral surface of the connecting element 411 and run substantially at right angles in the body 412.

Figure 13:
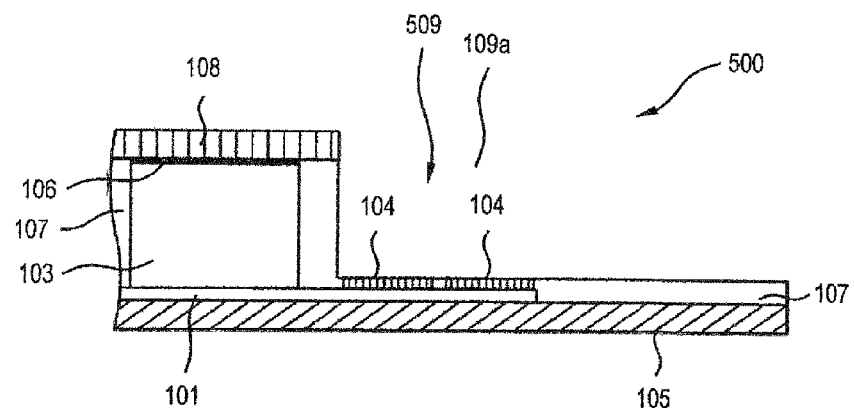
FIG. 13 shows a sectional illustration in a side view of a detail of a preliminary stage of a lighting device according to the disclosure in accordance with a fifth embodiment.

FIG. 13 shows a sectional illustration in a side view of a detail of a preliminary stage of a lighting device 500 in accordance with a fifth embodiment similar to the preliminary stage shown in FIG. 4. In the lighting device 500, the cut-away portion 509 now no longer has a laterally closed channel, but is open over the entire areas at the top. The cut-away portion 509 can therefore also be considered to be an outwardly leading, open channel. This simplifies the introduction of the cut-away portion 509. In this case, side walls (not illustrated) of the mount 105 can provide lateral delimitation of the cut-away portion 509. However, the cut-away portion 509 opens towards the front end side.

Figure 14:
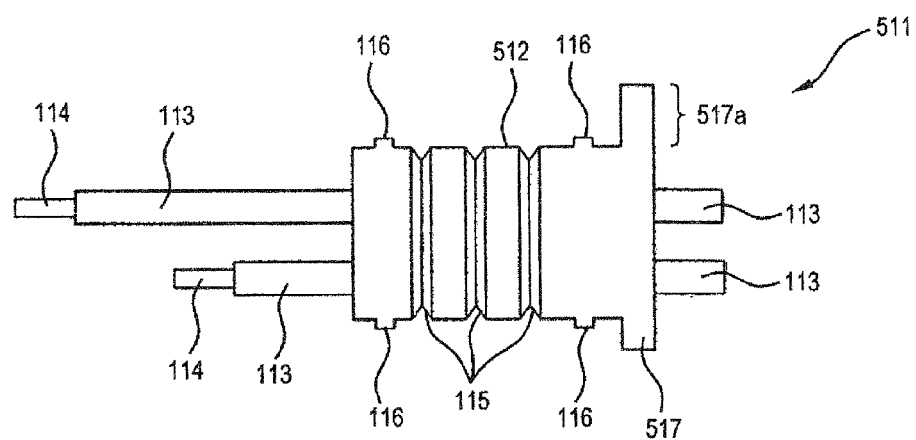
FIG. 14 shows a side view of an electrical connecting element of the lighting device in accordance with a fifth embodiment.

FIG. 14 shows a side view of an electrical connecting element 511 for use with the lighting device 500. The electrical connecting element 511 has a similar construction to the connecting element 111, but now the wall 517 of the body 512 has a nonuniform height with respect to its circumferential position. As a result, a maximum fill height of the second casting compound 119 may be defined, in particular by means of a region 517a of the wall 517 with the highest height. The wall 517 furthermore serves to shutoff the cut-away portion 509 on the outside.

Figure 15:
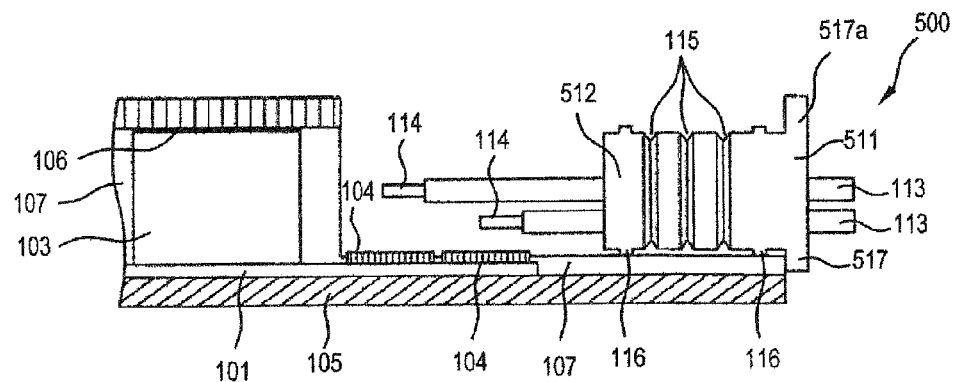
FIG. 15 shows a sectional illustration in a side view of a detail of a following preliminary stage of the lighting device in accordance with the fifth embodiment with a connecting element inserted.

FIG. 15 shows a detail of a following preliminary stage of the lighting device 500, in which the connecting element 511 is now inserted into the cut-away portion 509. In this case, too, the position of the ends 114 of the electrical lines 113 in plan view corresponds to the position of the connection areas 104.

Figure 16:
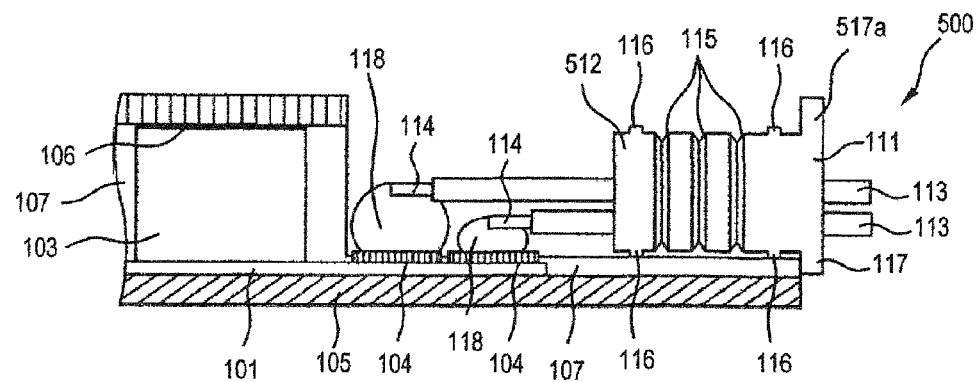
FIG. 16 shows a sectional illustration in a side view of a detail of a further preliminary stage of the lighting device in accordance with the fifth embodiment.

FIG. 16 shows a further preliminary stage of the lighting device 500, in which the ends 114 and the connection areas 104 are mechanically and electrically connected to one another by solder 118.

Figure 17:
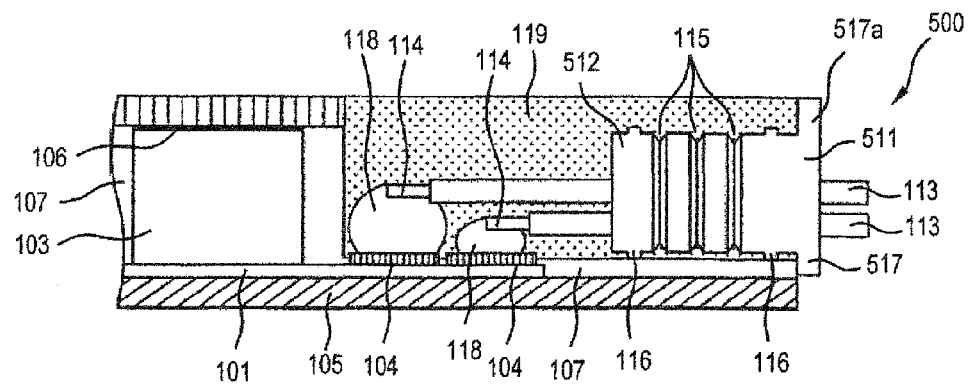
FIG. 17 shows a sectional illustration in a side view of the finished lighting device in accordance with the fifth embodiment.

FIG. 17 shows the finished lighting device 500, in which the cut-away portion 509 is cast with the second casting compound 119. The cut-away portion 509 enables particularly complete (inclusion-free) coverage of the body 512 (apart from the wall 517) with the second casting compound 119.

Figure 18:
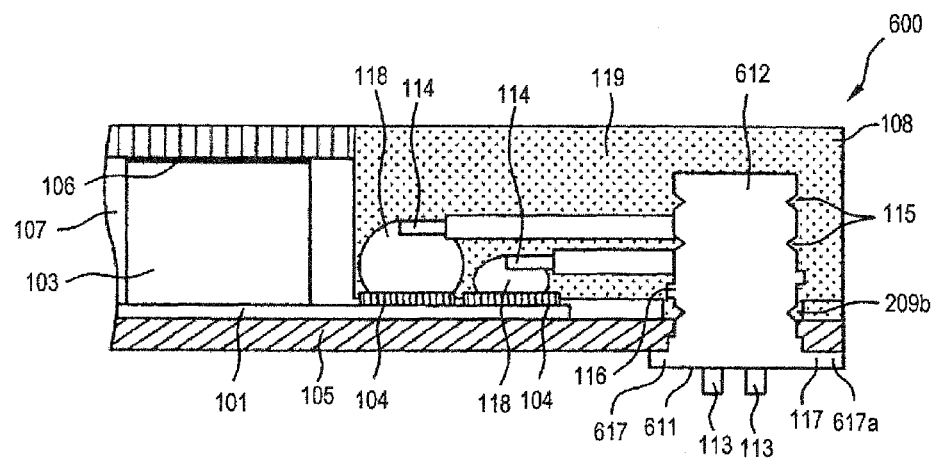
FIG. 18 shows a sectional illustration in a side view of a lighting device in accordance with a sixth embodiment.

FIG. 18 shows a lighting device 600 in accordance with a sixth embodiment. The lighting device 600 combines the configuration of the lighting device 500 with an electrical connecting element 611, which is aligned downward similarly to the lighting device 200. In this case, the region 617a of the wall 617 of the body 612 with the highest height defines a front end-side extent of the second casting compound 119.

In this lighting device 600, it is preferred that it is combined detachably with one or more moldings (not depicted) in its preliminary stage, in which the casting compound 119 has not yet been introduced, in order to be able to cast (or inject) the second casting compound 119 in a defined manner.

Figure 19:
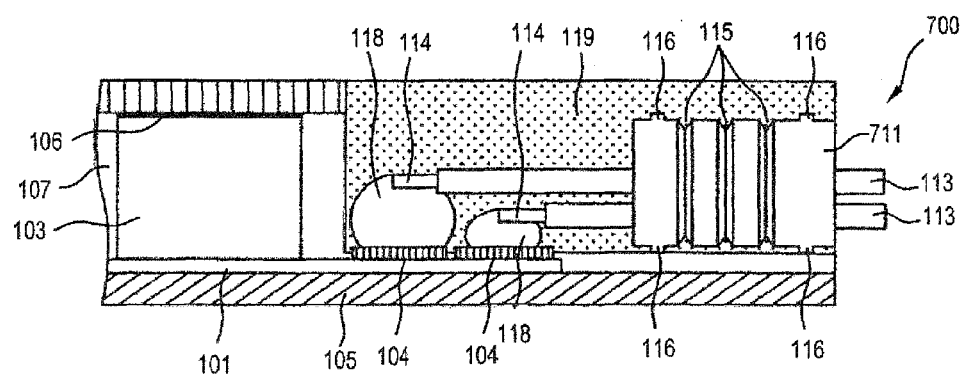
FIG. 19 shows a sectional illustration in a side view of a lighting device in accordance with a seventh embodiment.

FIG. 19 shows a sectional illustration in a side view of a lighting device 700 in accordance with a seventh embodiment. The lighting device 700 combines the configuration of the lighting device 500 with an electrical connecting element 711, which does not have a laterally protruding wall provided for shutting off the cut-away portion 509.

In this lighting device 700 as well, it is preferred that it is combined detachably with one or more moldings (not depicted) in its preliminary stage, in which the casting compound 119 has not yet been introduced, in order to be able to cast (or inject) the second casting compound 119 in a defined manner, to be precise also in the case of a laterally aligned electrical connecting element 711.

The disclosure is of course not restricted to the embodiments shown.

Thus, the connection element for all lighting devices can in principle be passed out or aligned at the front end, at the bottom or at a side wall.

The disclosure is not restricted to lighting strips either.

While the disclosed embodiments has been particularly shown and described with reference to specific embodiments, it should be understood by those skilled in the art that various changes in form and detail may be made therein without departing from the spirit and scope of the disclosed embodiments as defined by the appended claims. The scope of the disclosed embodiments is thus indicated by the appended claims and all changes which come within the meaning and range of equivalency of the claims are therefore intended to be embraced.

LIST OF REFERENCE SYMBOLS

100 Lighting device
101 Printed circuit board
102 Front side of the printed circuit board
103 Light-emitting diode
104 Connection area
105 Mount
106 Emitter face of light-emitting diode
107 First, lower casting compound
108 First, upper casting compound
109 Cut-away portion of first casting compound
109a Upwardly open subregion of cut-away portion
109b Channel
111 Connecting element
112 Body of connecting element
113 Electrical line of connecting element
114 End of electrical line
115 Groove in body
116 Spacer of body
117 Laterally protruding wall of body
118 Solder
119 Second casting compound
200 Lighting device
209 Cut-away portion
209b Channel of cut-away portion
300 Lighting device
301 Longitudinal side of lighting device
400 Lighting device
411 Electrically connecting element
412 Body of connecting element
500 Lighting device 509 Cut-away portion
511 Electrical connecting element
512 Body
517 Wall
517a Region of wall with the highest height
600 Lighting device
611 Electrical connecting line
612 Body
617 Wall
617a Region of wall with highest height
700 Lighting device
711 Electrical connecting element
B Width of printed circuit board
F Lighting strip
L Length of printed circuit board

The invention claimed is:

1. A lighting device, comprising at least one semiconductor light source cast with at least one first casting compound, wherein at least one region of the lighting device has:
   at least one connection area, which is electrically connected to the at least one semiconductor light source, and
   at least one electrical connecting element, which has at least one electrical line,
   wherein
   at least one electrical line is connected to an associated connection area and protrudes at one end out of the lighting device, and
   the at least one connection area and the at least one electrical connecting element are arranged in a cutout in the at least one first casting compound and are cast by means of a second casting compound.

2. The lighting device as claimed in claim 1, wherein the at least one electrical connecting element has a body, through which at least one electrical line is passed.

3. The lighting device as claimed in claim 1, wherein the at least one electrical connecting element has two or four electrical lines.

4. The lighting device as claimed in claim 1, wherein the at least one connection area is exposed with respect to the at least one first casting compound by means of the at least one cutout, and the at least one electrical connecting element is accommodated in a laterally closed channel which leads outward and closes the channel on the outside.

5. The lighting device as claimed in claim 1, wherein the at least one connection area is exposed with respect to the at least one first casting compound by means of the at least one cutout, and the at least one electrical connecting element is accommodated in an open channel which leads outward and closes the channel on the outside.

6. The lighting device as claimed in claim 1, wherein the at least one connection area is inhibited with respect to a first casting compound directly covering the at least one connection area.

7. The lighting device as claimed in claim 1, wherein the at least one first casting compound has a lower casting compound, by means of which the at least one semiconductor light source is cast up to below its emitter face, and an upper casting compound, by means of which the emitter face is cast.

8. The lighting device as claimed in claim 1, wherein the lighting device is a lighting strip, and the regions of the lighting device are end regions.

9. The lighting device as claimed in claim 2, wherein the body has at least one groove on the outside.

10. The lighting device as claimed in claim 2, wherein the body has at least one spacer on the outside.

11. The lighting device as claimed in claim 2, wherein the body has a laterally protruding, peripheral wall on the side on which the at least one associated electrical line emerges from the lighting device.

12. The lighting device as claimed in claim 11, wherein the wall has a nonuniform height.

13. A method for producing a lighting device, wherein the method comprising:
   providing a lighting device, which has at least one semiconductor light source and at least one connection area, which is electrically connected to the at least one semiconductor light source, which the at least one semiconductor light source is cast by means of at least one first casting compound;
   removing some of the first casting compound, with the result that the at least one connection area is exposed and is connected to an outer side via a channel;
   inserting an electrical connecting element with at least one electrical line into the channel, with the result that the electrical connecting element shuts off the channel and the at least one electrical line protrudes outward;
   connecting at least one electrical line of the electrical connecting element to a respective connection area; and
   casting the at least one connection area and the at least one electrical connecting element with at least one second casting compound.

14. The method as claimed in claim 13, further comprising:
   inhibiting the at least one connection area;
   casting the at least one semiconductor light source and the at least one connection area to the at least one first casting compound,
wherein inhibiting the at least one connection area comprises inhibiting with respect to the first casting compound which directly covers the at least one connection area.

* * * * *